United States Patent [19]
Law et al.

[11] Patent Number: 4,667,179
[45] Date of Patent: May 19, 1987

[54] TWO REFERENCE VOLTAGE WEIGHTED CAPACITOR DIGITAL TO ANALOG CONVERTER

[75] Inventors: Simon M. Law, Torrance; Thierry L. Watteyne, Rancho Palos Verdes, both of Calif.; Dung N. Tran, Wescosville, Pa.

[73] Assignee: Xerox Corporation, Stamford, Conn.

[21] Appl. No.: 709,638

[22] Filed: Mar. 7, 1985

[51] Int. Cl.[4] ............................................. H03M 1/68
[52] U.S. Cl. ...................... 340/347 DA; 340/347 AD; 340/347 M
[58] Field of Search ....... 340/347 DA, 347 C, 347 M, 340/347 NT

[56]         References Cited
         U.S. PATENT DOCUMENTS
2,775,754  12/1956  Sink .............................. 340/347 DA
4,077,035   2/1978  Yee ............................... 340/347 DA Primary Examiner—T. J. Sloyan
Attorney, Agent, or Firm—Franklyn C. Weiss

[57]            ABSTRACT

A weighted capacitor digital to analog converter is disclosed which requires only one stage and one conversion step. By the use of two reference voltages and two groups of capacitors in parallel, various capacitors in these groups can be selectively switched from the reference voltages to ground potential in response to input binary digit signals thereby presenting a predetermined amount of voltage to the output amplifier depending upon the number and particular combination of capacitors switched or non-switched to ground.

1 Claim, 1 Drawing Figure

TWO REFERENCE VOLTAGE WEIGHTED CAPACITOR DIGITAL TO ANALOG CONVERTER

This invention relates to a weighted capacitor digital to analog converter which utilizes two reference voltages in conjunction with two groups of capacitors with each capacitor being selectively switched to ground potential in order to convert an input digital signal to an output analog signal.

BACKGROUND OF THE INVENTION

Weighted capacitor digital to analog converters have been described in the prior art for use in converting a digital signal to an analog signal. Resistive arrays have not been satisfactory due to the low packing density and large non-linearity. Other weighted capacitor digital to analog converters either utilized too many conversion steps or too many components.

According to the present invention, a weighted capacitor digital to analog converter is disclosed which requires only one stage and one conversion step. By the use of two reference voltages and two groups of capacitors in parallel, various capacitors in these groups can be selectively switched from the reference voltages to ground potential in response to input binary digit signals thereby presenting a predetermined amount of voltage to the output amplifier depending upon the number and particular combination of capacitors switched or non-switched to ground.

DESCRIPTION OF THE DRAWING

For a more complete understanding of the invention, reference may be had to the following detailed description of the invention in conjunction with the drawing wherein the FIGURE is a schematic diagram of the two reference voltage weighted capacitor digital to analog converter in accordance with the principles of the present invention.

DETAILED DESCRIPTION OF THE INVENTION

Figure 1:
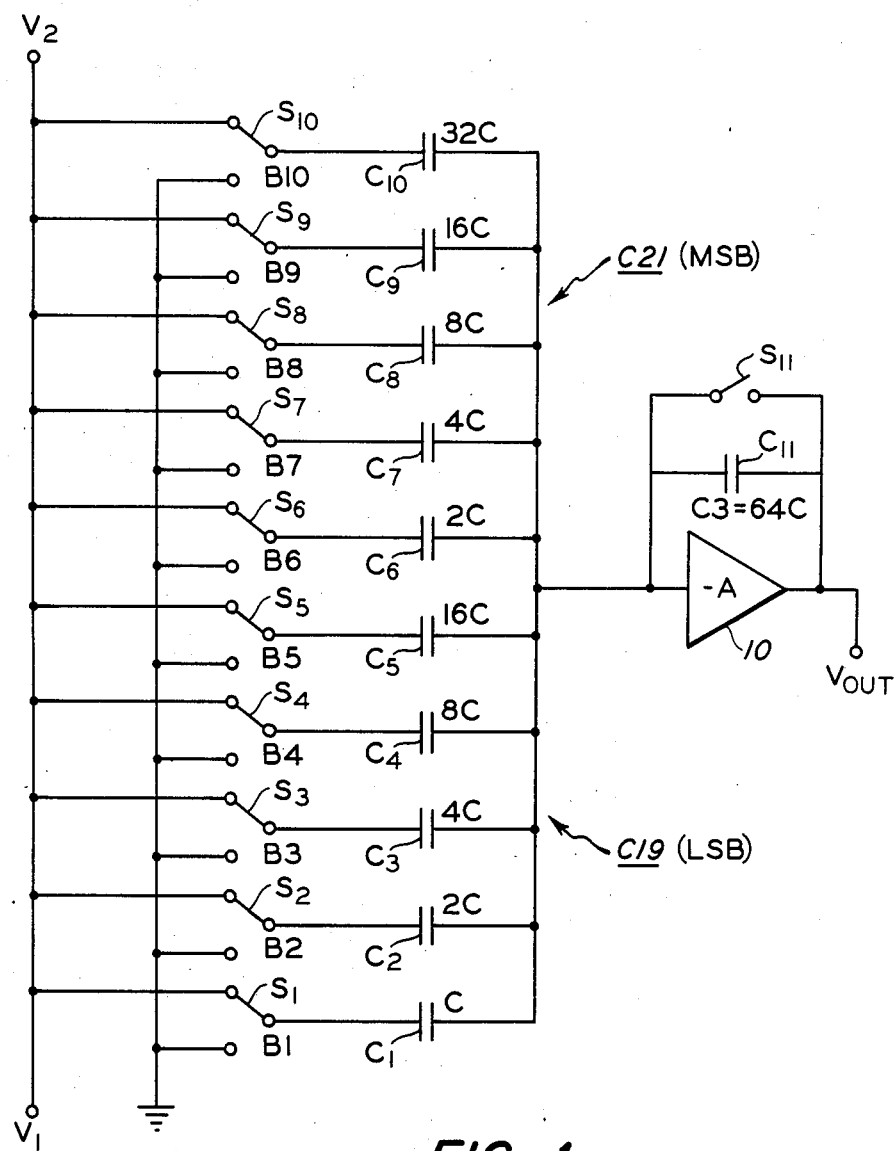

Certain technological development programs require a large quantity of digital to analog converters, such as for ink jet or other marking technology techniques. The design objectives of the digital to analog converters are high speed, with a conversion time of less than one microsecond, ten bit resolution and a high packing density. The following description refers to a ten bit implementation, but the invention can be extended to be applied to any digital to analog converter with any number of binary digits.

The invention utilizes two sets of C19, C21 of binary weighted capacitors switched at the same time on two different reference voltages. Switches S1 through S10 would be switched in response to digital inputs B1 through B10 with B1 being the least significant and B10 being the most significant bit. Capacitors C1 through C5 comprise a first group of capacitors C19 or the least signficant bit while capacitors C6 through C10 comprise a second group of capacitors C21 or the most significant bit. When a binary digit corresponding to a binary one is applied to any one of the switches S1 through S10, the selected switches are switched from a reference voltage V1 or V2 to ground potential. The five least significant bits B1 to B5 switch from reference voltage V1 to ground and the five most significant bits B6 to B10 switch from reference voltage V2 to ground, if selected, with a ratio of, for example, $$V2/V1 = 16$$

Switch S11 effectively resets the digital to analog converter by setting the output of amplifier 10 to the same reference potential as its input. That is, switch S11, when closed, effectively equalizes the potential across capacitor C11 such that when switch S11 is opened, there is no residual potential across capacitor C11.

The digital to analog conversion begins with switches S1 to S10 applying the reference voltages V1 or V2 with V1 for switches S1 to S5 and reference voltage V2 for switches S6 through S10 to the capacitors C1 to C10. Switch S11 would then be opened and then the binary digits B1 to B10 would be applied to switches S1 to S10. A binary digit equal to one will change the application of reference voltages V1 to V2 to ground potential to discharge the corresponding capacitor. The change in output voltage as amplified by amplifier 10 would then be $$v(out) = \left[ \frac{(B1C1 + B2C2 + B3C3 + B4C4 + B5C5)V1 + (B6C6 + B7C7 + B8C8 + B9C9 + B10 + C10)V2}{\left( C11 + \frac{C11 + C1 + C2 + C3 + C4 + C5 + C6 + C7 + C8 + C9 + C10)}{A} \right)} \right] + V(or)$$

where $V_{or}$ is the reset output voltage, and A is the gain of that amplifier. The equation clearly indicates that the change of the output voltage, Vout is directly proportional to the input binary ratio B1 through B10. The capacitive ratio given in the FIGURE corresponds to a voltage reference ratio of 16(V2/V1=16).

Other ratios for the reference voltages V1 and V2 and capacitor values for C1 through C10 can be chosen to define the analog voltage out for the various combination of binary digits applied.

Thus, one can adopt the values of the capacitors C1 through C10 and C11 in order to achieve the same transfer function. For instance, one can use the ratio $$V2/V1 = 32$$

with two identical sets of capacitors wherein C1 equals C6, C2 equals C7, etc.

By using the two reference voltage technique, the maximum capacitive ratio is 64 to 1, utilizing the principles of the present invention instead of the 512 to 1 used in the conventional techniques. The reduction of capacitive ratio will result in a reduction of integrated circuit chip area. Another advantage would be that this weighted capacitor digital to analog converter system is not sensitive to parasitic capacitance. The single input amplifier 10 can be used for high speed because the input offset does not affect any performance of the digital to analog converter. Unlike two stage digital to analog conveters and two step digital to analog converters, the differential linearity is not affected by the finite gain A of amplifier 10. Further, the present invention requires only one conversion step as compared with two step digital to analog converters that require two conversion steps. Unlike two stage digital to analog converters or two step digital to analog converters, the fact that the smallest capacitor C involves only the least significant bit, allows the use of this capacitor only half the unit capacity used to build all the other capacitors which divides the total area on an integrated circuit by 2.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A weighted capacitor digital to analog converter comprising:
   a first reference voltage (V1),
   a first group of capacitors (C19), one electrode of each being mutually connected,
   a first group of switches (S1) for electrically connecting the other electrodes of said first group of capacitors either to said first reference voltage or ground potential,
   a second reference voltage (V2),
   a second group of capacitors (C21), one electrode of each being mutually connected and also connected to the mutually connected electrodes of said first group of capacitors,
   a second group of switches (S6) for selectively connecting the other electrodes of said second group of capacitors either to said second reference voltage or ground potential, said first and second groups of switches being selectively switched upon a binary digital signal being applied to each of said switches, a combination of output voltages being applied to the mutually connected electrodes of said capacitors as the output analog signal,
   an amplifier (A) for amplifying the output analog signal as received from said groups of capacitors,
   an output capacitor (C11) coupling the output of said amplifier to said input of said amplifier for providing voltage feedback to said amplifier, and
   an output switch (S11) coupled across said capacitor for neutralizing the charge on said capacitor and thereby neutralizing the output voltage in relation to the input voltage of said amplifier, wherein said output voltage is determined from the relationship $$V_{out} = \left[ \frac{(B1C1 + B2C2 + B3C3 + B4C4 + B5C5)V1 + (B6C6 + B7C7 + B8C8 + B9C9 + B10C10)V2}{C11 + \left( \frac{(C11 + C1 + C2 + C3 + C4 + C5 + C6 + C7 + C8 + C9 + C10)}{A} \right)} \right] + V_{or},$$

where B equals a binary value, C equals the respective capacitive values, A is the gain of the amplifier, $V_{or}$ is the reset output voltage, $V_1$ is said first reference voltage, and V2 is said second reference voltage.

* * * * *